(12) United States Patent
Shen et al.

(10) Patent No.: US 10,475,677 B2
(45) Date of Patent: Nov. 12, 2019

(54) PARALLEL TEST STRUCTURE

(71) Applicant: GLOBALFOUNDRIES INC., Grand Cayman (KY)

(72) Inventors: Tian Shen, Clifton Park, NY (US); Anil Kumar, Clifton Park, NY (US); Yuncheng Song, Halfmoon, NY (US); Kong Boon Yeap, Clifton Park, NY (US); Ronald G. Filippi, Jr., Wappingers Falls, NY (US); Linjun Cao, Ballston Lake, NY (US); Seungman Choi, Loudonville, NY (US); Cathryn J. Christiansen, Huntington, VT (US); Patrick R. Justison, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 220 days.

(21) Appl. No.: 15/682,704

(22) Filed: Aug. 22, 2017

(65) Prior Publication Data

US 2019/0067056 A1 Feb. 28, 2019

(51) Int. Cl.
*H01L 21/67* (2006.01)
*G01R 3/00* (2006.01)
(Continued)

(52) U.S. Cl.
CPC .......... *H01L 21/67253* (2013.01); *G01R 3/00* (2013.01); *G01R 31/129* (2013.01);
(Continued)

(58) Field of Classification Search
CPC .............. H01L 21/67253; H01L 22/34; G01R 31/2858; G01R 31/2879; G01R 31/129; G01R 3/00; G01R 31/1272
See application file for complete search history.

(56) References Cited

U.S. PATENT DOCUMENTS 9,013,202 B2 4/2015 Chen et al.
2002/0033710 A1 3/2002 Kim
(Continued)

FOREIGN PATENT DOCUMENTS

CN 101702005 A 5/2010
CN 202352661 U 7/2012

OTHER PUBLICATIONS

Taiwanese Application No. 107110064, Examination Report dated Jan. 28, 2019, pp. 1-4 and Search Report dated Jan. 23, 2019, pp. 5-12.

(Continued)

*Primary Examiner* — Daniel R Miller
(74) *Attorney, Agent, or Firm* — Gibb & Riley, LLC; Michael J. LeStrange, Esq.

(57) ABSTRACT

An exemplary apparatus includes a testing module connected to, and providing a test voltage to, an integrated circuit containing devices under test. The testing module performs a time-dependent dielectric breakdown (TDDB) test on the devices under test. A decoder is connected to the devices under test and the testing module. The decoder selectively connects each device being tested to the testing module. Efuses are connected to a different one of the devices under test. The efuses separately electrically disconnect each of the devices under test from the test voltage upon failure of a corresponding device under test. Protection circuits are connected between the efuses and a ground voltage. Each protection circuit provides a shunt around the decoder upon failure of the device under test.

19 Claims, 3 Drawing Sheets

(51) Int. Cl.
    *G01R 31/12*         (2006.01)
    *H01L 21/66*         (2006.01)
    *G01R 31/28*         (2006.01)

(52) U.S. Cl.
    CPC ..... *G01R 31/1272* (2013.01); *G01R 31/2858* (2013.01); *G01R 31/2879* (2013.01); *H01L 22/34* (2013.01)

(56) References Cited

U.S. PATENT DOCUMENTS

2013/0314119 A1    11/2013    Chen et al.
2016/0025805 A1*    1/2016    Uppal ................ G01R 31/2884
                                                                           324/750.3
2016/0061880 A1     3/2016    Uppal

OTHER PUBLICATIONS

Taiwanese Application No. 107110064, Notice of Allowance dated Jun. 20, 2019, pp. 1-3.

\* cited by examiner

PARALLEL TEST STRUCTURE

BACKGROUND

The present disclosure relates to the design of integrated circuits, and more specifically, to structures and methods for parallel testing of large numbers of devices.

An integrated circuit (IC) is a semiconductor device containing many small, interconnected components such as diodes, transistors, resistors, and capacitors. These components function together to enable the IC to perform a task, such as control an electronic device, or perform logic operations. ICs are found in computers, calculators, cellular telephones, and many other electronic devices.

ICs and other semiconductor devices are fabricated on small rectangles, known as "dies," which are filled with multiple layers of the components, such as transistors, resistors, and capacitors, during the fabrication process. Generally, a plurality of process technologies are currently practiced, wherein, for many types of complex circuitry, including field effect transistors, MOS and as well as metal insulator semiconductor (MIS) technologies are currently among the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors are formed on a substrate including a crystalline semiconductor layer.

Various processes are performed on semiconductor substrates in manufacturing integrated circuit products. A manufacturing error in one of the components may render an IC or semiconductor device incapable of functioning properly. For example, consider a memory device containing several ICs. If a transistor within one of the ICs fails to function properly, the memory device may produce memory errors. Therefore, when integrated circuits are formed, tests are performed to determine the correctness in the operation of the circuits.

Manufacturers generally perform various tests to determine the effects of the various processes on the performance and reliability of the circuits. Various quality or performance criterions may be used in determining whether the integrated circuits meet quality standards. In particular, conventional Time Dependent Dielectric Breakdown (TDDB) test can typically only test a maximum of 24 devices in parallel from the same test macro at the same time. In addition, limited by the number of source measurement units (SMUs), the real testing is only limited to eight devices in parallel. In advanced technology node, die-to-die variations become the largest TDDB performance limiter. Thus, more data points need to be collected within each die to separate intrinsic TDDB performance from global variations. No cost effective test implementation (structure and test system) is available for massive parallel TDDB test at individual die level.

SUMMARY

Disclosed herein is a testing structure for semiconductor structures and, more particularly, a metal-to-metal or a metal-to-silicon substrate leakage and breakdown testing structure for semiconductor structures and a method of using the testing structure. Specifically, the testing structure disclosed herein is a time-dependent dielectric breakdown (TDDB) testing structure that combines a decoder, electrostatic discharge (ESD) diode, and Efuse as a whole to perform the desired TDDB reliability test. The use of the ESD diode and Efuse isolates the test structure and internal circuit so high voltage reliability stress can be carried on without requiring the decoder to sustain high voltage reliability stress. Structures and methods herein enable the test methodology for massive TDDB data generation (i.e., 1024 devices per die for a 10 bit decoder), with much more accurate extrapolation of process reliability.

An exemplary apparatus includes a testing module connected to, and providing a test voltage to, an integrated circuit containing devices under test. The testing module performs a time-dependent dielectric breakdown (TDDB) test on the devices under test. A decoder is connected to the devices under test and the testing module. The decoder selectively connects each device being tested to the testing module. Efuses are connected to a different one of the devices under test. The efuses separately electrically disconnect each of the devices under test from the test voltage upon failure of a corresponding device under test. Protection circuits are connected between the efuses and a ground voltage. Each protection circuit provides a shunt around the decoder upon failure of the device under test.

An exemplary circuit includes one or multiple voltage source, a current measuring device and devices under test connected to the voltage source on a first side and connected to the current measuring device on a second side. Pass transistors are connected between each device under test and the current measuring device. A decoder selectively provides a pass signal to each pass transistor. The decoder selects the device for testing. Efuses are connected to the second side of a different one of the devices under test between a device under test and a corresponding pass transistor. The efuses break the electric circuit for the device under test from the voltage source upon failure of the corresponding device under test. Shunt circuits are connected between the efuses and a ground voltage. Each shunt circuit electrically protects the decoder upon failure of the device under test.

According to an exemplary method herein, an electrical circuit having devices for testing is provided. Test voltages are provided and the test voltages are applied to the devices according to a time-dependent dielectric breakdown (TDDB) test on the devices. A decoder is provided. The decoder produces a selection signal that sequentially selects one of the devices performing the TDDB test. Leakage current is measured from the one of the devices selected for testing. An efuse is arranged to protect each device. Responsive to TDDB failure of the device, the device is protected using an efuse arranged in the electrical circuit. Responsive to TDDB failure of the device, the decoder is electrically isolated from each device using a protection circuit arranged in the electrical circuit.

BRIEF DESCRIPTION OF THE DRAWINGS

The devices and methods will be better understood from the following detailed description with reference to the drawings, which are not necessarily drawn to scale and in which.

DETAILED DESCRIPTION

Manufacturers generally perform tests that help determine the dielectric failure prospects in order to determine the reliability of the circuits. Generally, a primary test that is performed in order to determine the dielectric failure prospects is the TDDB test.

The TDDB test relates to determining when a circuit portion, such as the gate of a transistor, breaks down. This may be caused by weakness in portions of the dielectric. A determination may be made as to when the dielectric part of the circuit portion breaks down at certain particular current-levels, voltage levels, and/or temperature levels. In the example of a transistor, the breakdown would keep the gate of the transistor from operating properly as a switch that could control the current flow through the source and the drain of the transistor.

TDDB tests are typically performed under DC bias condition of 1.5-20 V at a temperature of approximately 125° C. using a basic test structure, which is typically a two terminal capacitor. Leakage current is recorded for each device for breakdown detection. Typically, multiple different voltage stresses are required, to extract a voltage acceleration factor. Circuits described herein enable testing at high voltages for Middle of Line (MOL) and Back End Of Line (BEOL) TDDB, and are not limited solely for gate oxide TDDB.

Accurate lifetime prediction for TDDB requires a large set of samples to be tested under accelerated voltage/temperature stress conditions. One of the problems with the state-of-the-art testing systems is that the number of devices under test (DUTs) at a given time period is limited. For example, the number of DUTs may be limited by the number of test pins available on a testing circuit. This causes several problems, such as limitations as to the data available for determining breakdown statistics for a particular accelerated test. Moreover, since the break process is slow (in the order of hours to days), parallel testing is preferred in order to save test time. Additionally, state-of-the-art testing regimens involve determining a so-called beta parameter. When using testing across the wafer to determine beta, the state-of-the-art beta parameter provides indications of global variability, but fail to efficiently capture the local variability at the chip level. Thus, the intrinsic reliability is not efficiently provided by the state-of-the-art testing regimen. This makes the task of determining whether one process produced intrinsically superior dielectric from another all the more difficult.

Figure 1:
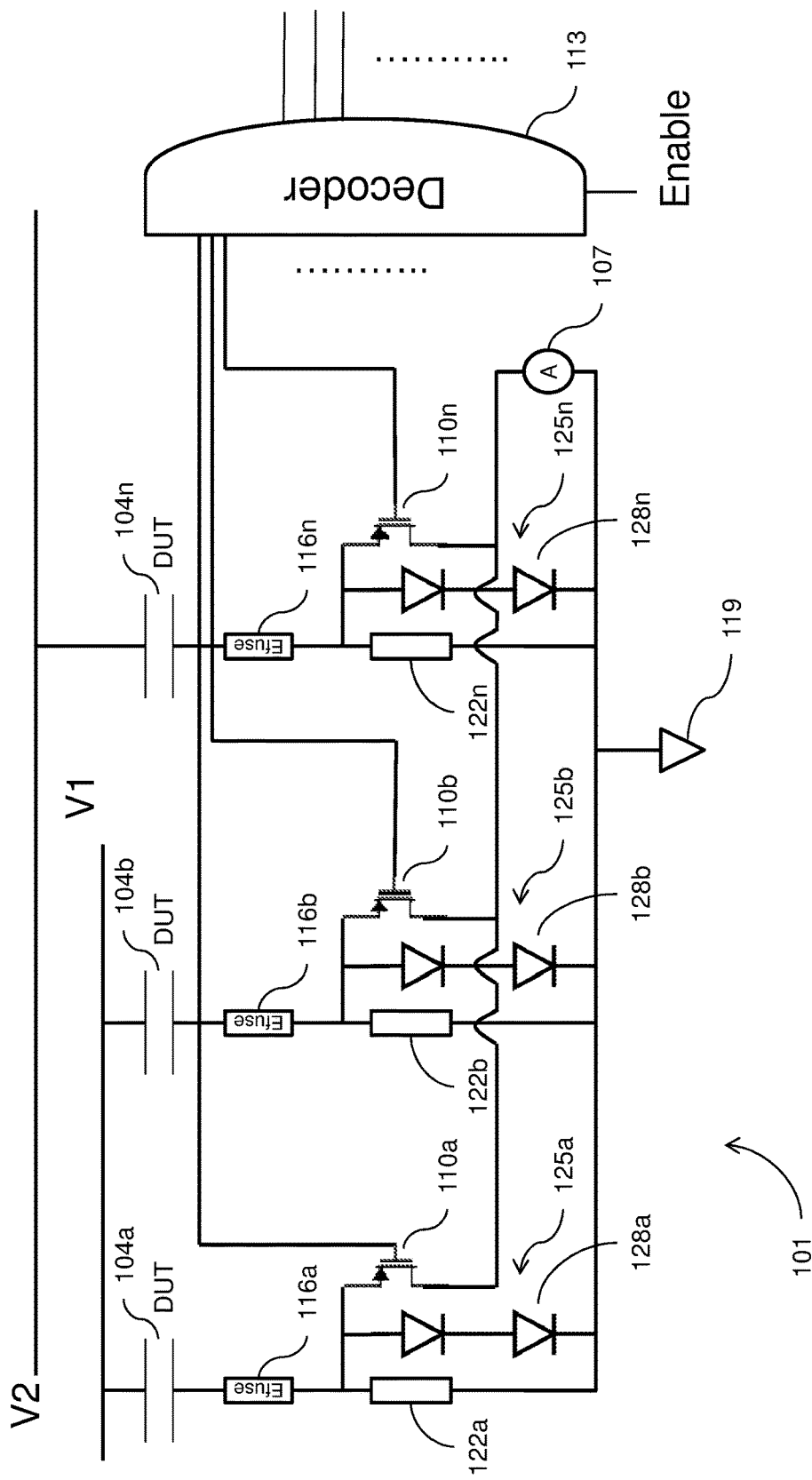
FIG. 1 is a schematic diagram of an exemplary testing circuit according to devices and methods herein.

Referring now to the drawings, FIG. 1 is a schematic diagram of an exemplary testing circuit, indicated generally as 101. The testing circuit 101 may be used to test a plurality of devices under test (DUTs) 104a, 104b, . . . , 104n. Each device under test may include a two terminal device connected to a test voltage. For example, the DUTs may include two metal elements having a dielectric material, e.g., low-k dielectric material, provided between the metal elements. The DUTs can have different patterns, with different separations between the metal elements. Although only a limited number of DUTs, namely 104a, 104b, . . . , 104n, are shown, it should be understood by those of skill in the art that two or more DUTs are contemplated by the present disclosure. Further, it should be understood by those of skill in the art that different test voltages, e.g., as indicated by V1 and V2, could be applied to different subsets of DUTs 104a, 104b, . . . , 104n for testing.

The testing circuit 101 also includes a current measuring device 107. The DUTs 104a, 104b, . . . , 104n are connected to the voltage source on a first side and connected to the current measuring device 107 on a second side. Pass transistors 110a, 110b, . . . , 110n are connected between the DUTs 104a, 104b, . . . , 104n and the current measuring device 107. The testing circuit 101 further includes a decoder 113. The decoder 113 selectively provides a pass signal to each pass transistor 110a, 110b, . . . , 110n. The pass signal turns on each pass transistor 110a, 110b, . . . , 110n, one at a time, under the control of the decoder 113, in order to connect the second side of the DUTs 104a, 104b, . . . , 104n to the current measuring device 107. The current measuring device 107 measures dielectric leakage current through the DUTs 104a, 104b, . . . , 104n. The decoder 113 enables selectively reading the leakage current from each of the DUTs 104a, 104b, . . . , 104n in order to know exactly which ones failed temporally. The decoder 113 may be located on the same chip as the DUTs 104a, 104b, . . . , 104n and can measure the current for each device individually.

The testing circuit 101 also includes efuses 116a, 116b, . . . , 116n connected to the second side of a different one of the DUTs 104a, 104b, . . . , 104n between a device under test and a corresponding pass transistor 110a, 110b, . . . , 110n. When breakdown happens, the high voltage of the voltage source will short to ground, indicated at 119, through the corresponding efuse 116a, 116b, . . . , 116n and associated ESD diode 128a, 128b, . . . , 128n. The efuses 116a, 116b, . . . , 116n disrupt the test circuit by breaking the electric circuit for the failed DUTs 104a, 104b, . . . , 104n from the voltage source upon failure of the corresponding device under test. The efuses 116a, 116b, . . . , 116n may be metal fuses and may be located on the same chip as the DUTs 104a, 104b, . . . , 104n.

Typically, the maximum operation voltage for the pass transistor 110a, 110b, . . . , 110n is significantly less than the high stress voltage provided by the voltage source. For example, the maximum operation voltage for the pass transistor 110a, 110b, . . . , 110n may be approximately 1.8 V, or less, while the stress voltage may be much higher. When a DUT 104a, 104b, . . . , 104n fails, it essentially provides a short circuit through the device, which means there can be a large voltage potential over the associated pass transistor 110a, 110b, . . . , 110n. Eventually the corresponding efuse 116a, 116b, . . . , 116n will blow to disconnect the failed DUT 104a, 104b, . . . , 104n from the voltage source. Immediately prior to the efuse 116a, 116b, . . . , 116n blowing, there may be an instantaneous current spike. In order to protect the pass transistor 110a, 110b, . . . , 110n and the decoder 113, protection circuits 125a, 125b, . . . , 125n are connected between the efuses 116a, 116b, . . . , 116n and ground 119. The protection circuits 125a, 125b, . . . , 125n provide a shunt around the pass transistor 110a, 110b, . . . , 110n upon failure of the corresponding DUT 104a, 104b, . . . , 104n. The protection circuits 125a, 125b, . . . , 125n include one or more electrostatic discharge (ESD) diodes 128a, 128b, . . . , 128n.

The testing circuit 101 also includes resistors 122a, 122b, . . . , 122n connected to the second side of a different one of the efuses 116a, 116b, . . . , 116n between the efuses and the ground to form a low resistance path during normal stress conditions where the leakage current is very small. The resistance of the resistors 122a, 122b, . . . , 122n is much larger than the resistance of the pass transistors 110a, 110b, . . . , 110n when they are turned on, in order to force the majority of the current to flow through the current measuring device 107, but not too large to cause a significant voltage drop during the normal stress conditions. Post breakdown, the efuses 116a, 116b, . . . , 116n require a high current path to burn out, which needs low resistance in the current path and the ESD diodes 128a, 128b, . . . , 128n are used to discharge the high current at breakdown while providing large resistance at stress conditions because of the unique I-V characteristic of the ESD diodes 128a, 128b, . . . , 128n. The ESD diodes 128a, 128b, . . . , 128n and efuses 116*a*, 116*b*, . . . , 116*n* enable a wider stress voltage range, a wider resistance range of the resistors 122*a*, 122*b*, . . . , 122*n*, and a minimum disruption during the breakdown event on each test structure.

While the foregoing examples have discussed only a few test structures, those ordinarily skilled in the art would understand that the number of test structures is not limited and any of the devices and methods herein could include a large number of test structures, but such large numbers are not illustrated, simply for ease of illustration and to simplify understanding.

In operation, during test, the testing structure instructs the circuit to sequentially route a measured signal from each addressed location to a single output pin. By applying a series of addresses, the circuit, e.g., entire set of structures, can be scanned for fail signatures. The addressing information can then be used to identify the exact location of each failing site, i.e., determine a location of a failed circuit element. The failed circuit can be determined by the blown efuse and the current measured by the current measuring device.

Figure 2:
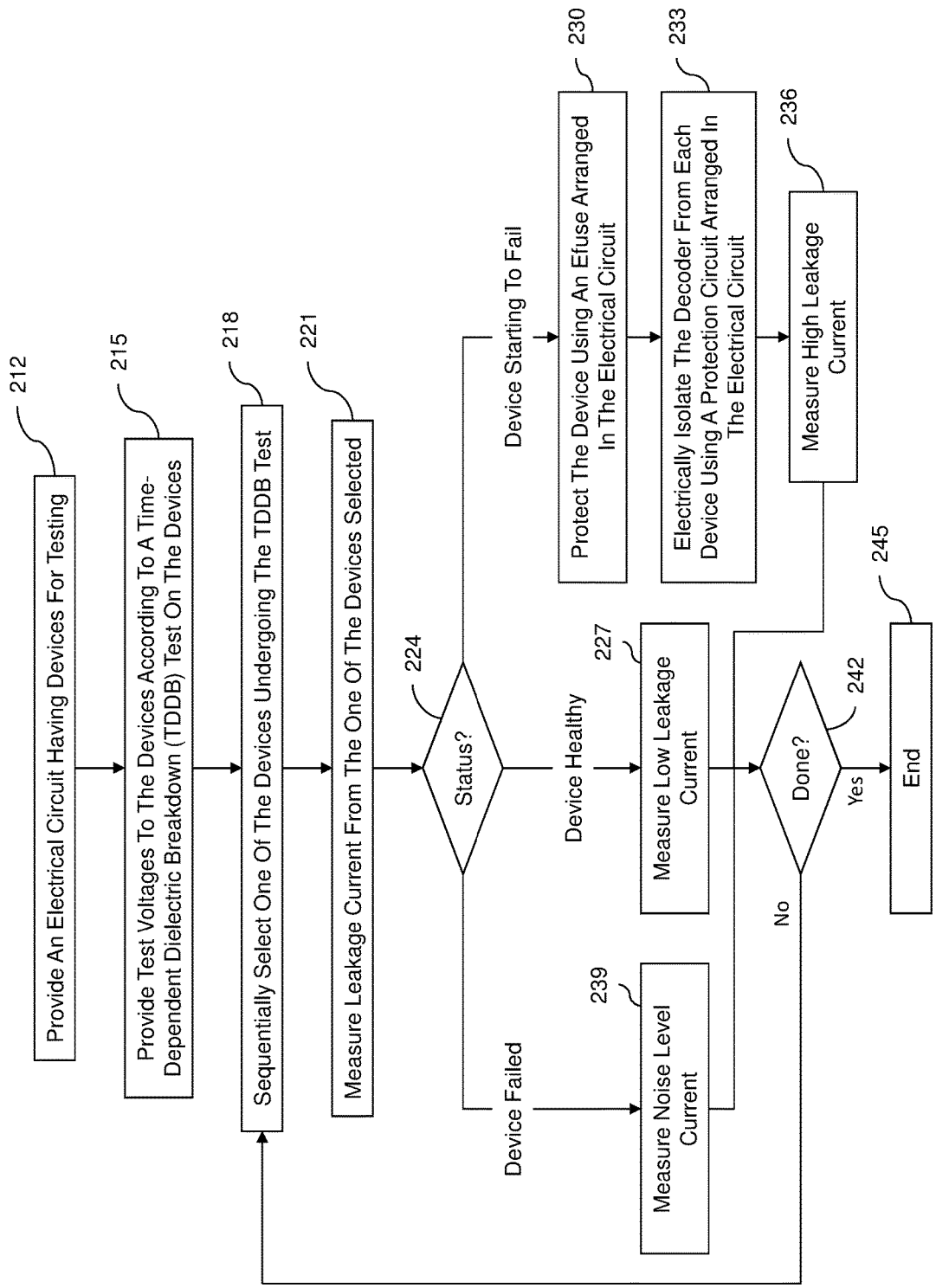
FIG. 2 is a flow diagram illustrating methods herein.

The structures described above may be used to save time and reduce destructive effects when testing, while allowing use of voltages greater than the maximum operation voltage of the decoder. FIG. 2 shows a logic flowchart for a method for testing integrated circuit devices, according to devices and methods herein. More specifically, in item 212, an electrical circuit having devices for testing is provided. At 215, a test voltage is provided and the test voltage is applied to the devices according to a time-dependent dielectric breakdown (TDDB) test on the devices. The test voltage may be the same or different for different devices under test. In some cases, the test voltage may be variable for an individual device under test. At 218, a decoder selects one of the devices undergoing the TDDB test. That is, the decoder produces a signal that sequentially selects one of the devices performing the TDDB test. In other words, while all devices are under TDDB test, the decoder selects one of the devices to read the leakage current. The decoder skips previously known failed devices. At 221, leakage current is measured from the one of the devices selected by the decoder. At 224, depending on the status of the device certain actions may occur. For example, if the device is healthy, low leakage current is measured, at 227. When the device is starting to fail, an efuse arranged in the electrical circuit protects the device, as shown at 230. At 233, responsive to TDDB failure of the device, the decoder is electrically isolated from each device using a protection circuit arranged in the electrical circuit. Measuring high leakage current, at 236, indicates failure of the device. If the device had already failed, its circuit is open and only noise level current is measured, at 239. TDDB testing is performed over a period of time. If the time limit has been reached or all the devices have failed, at 242, the test ends, at 245. Otherwise, the process continues and the next device is selected, at 218.

In summary, according to devices herein, an exemplary apparatus includes a testing module connected to, and providing a test voltage to, an integrated circuit containing devices under test. The testing module performs a time-dependent dielectric breakdown (TDDB) test on the devices under test. A decoder is connected to the devices under test and the testing module. The decoder selectively connects each device being tested to the testing module. Efuses are connected to a different one of the devices under test. The efuses separately electrically disconnect each of the devices under test from the test voltage upon failure of a corresponding device under test. Protection circuits are connected between the efuses and a ground voltage. Each protection circuit provides a shunt around the decoder upon failure of the device under test.

Figure 3:
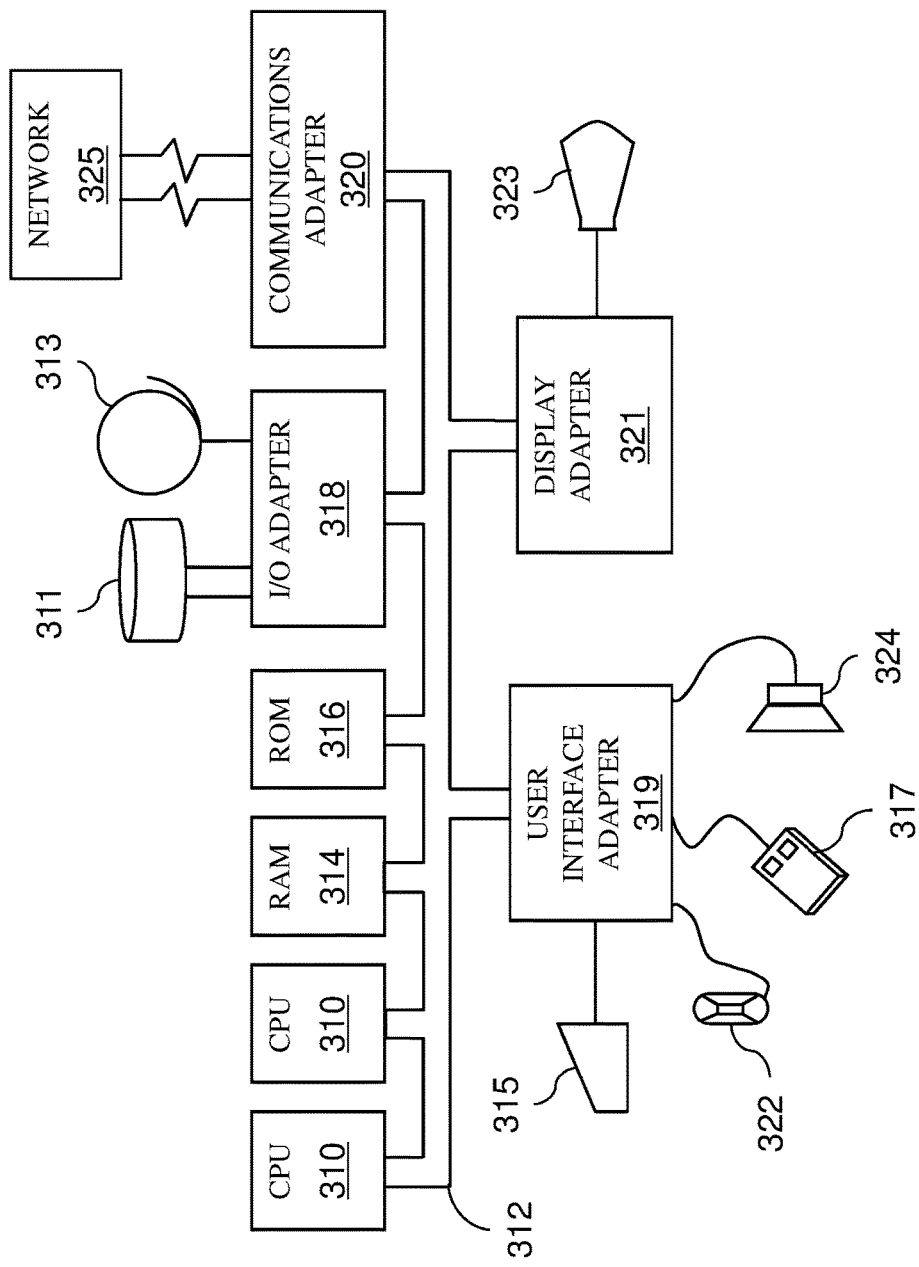
FIG. 3 is a schematic diagram of a hardware system according to devices and methods herein.

A representative hardware environment for practicing the systems and methods herein is depicted in FIG. 3. This schematic drawing illustrates a hardware configuration of an information handling/computer system in accordance with the systems and methods herein. The system comprises at least one processor or central processing unit (CPU) 310. The CPUs 310 are interconnected via system bus 312 to various devices such as a Random Access Memory (RAM) 314, Read Only Memory (ROM) 316, and an Input/Output (I/O) adapter 318. The I/O adapter 318 can connect to peripheral devices, such as disk units 311 and tape drives 313, or other program storage devices that are readable by the system. The system can read the inventive instructions on the program storage devices and follow these instructions to execute the methodology of the systems and methods herein.

In FIG. 3, CPUs 310 perform various processing based on a program stored in a Read Only Memory (ROM) 316 or a program loaded from a peripheral device, such as disk units 311 and tape drives 313 to a Random Access Memory (RAM) 314. In the RAM 314, required data when the CPU 310 performs the various processing or the like is also stored, as necessary. The CPU 310, the ROM 316, and the RAM 314 are connected to one another via a bus 312. An input/output adapter 318 is also connected to the bus 312 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 314, as necessary.

The system further includes a user interface adapter 319 that connects a keyboard 315, mouse 317, speaker 324, microphone 322, and/or other user interface devices such as a touch screen device (not shown) to the bus 312 to gather user input. Additionally, a communication adapter 320 including a network interface card such as a LAN card, a modem, or the like connects the bus 312 to a data processing network 325. The communication adapter 320 performs communication processing via a network such as the Internet. A display adapter 321 connects the bus 312 to a display device 323, which may be embodied as an output device such as a monitor (such as a Cathode Ray Tube (CRT), a Liquid Crystal Display (LCD), or the like), printer, or transmitter, for example.

Those skilled in the art would appreciate that the storage medium is not limited to the peripheral device having the program stored therein as illustrated in FIG. 3, which is distributed separately from the device for providing the program to the user. Examples of a removable medium include a magnetic disk (including a floppy disk), an optical disk (including a Compact Disk-Read Only Memory (CD-ROM) and a Digital Versatile Disk (DVD)), a magneto-optical disk (including a Mini-Disk (MD) (registered trademark)), and a semiconductor memory. Alternatively, the storage medium may be the ROM 316, a hard disk contained in the storage section 311, or the like, which has the program stored therein and is distributed to the user together with the device that contains them.

The hardware system illustrated in FIG. 3 can be used to implement the testing circuit 101 in accordance with aspects of the present disclosure. The CPUs 310 can be connected to the decoder 113 to provide instructions for the decoder 113 to output a selection of a specific pass transistor 110*a*, 110*b*, ..., 110*n*. That is, the instructions are used by the decoder 113 to selectively and individually turn on each pass transistor 110*a*, 110*b*, ..., 110*n* for measuring leakage of a respective DUT 104*a*, 104*b*, ..., 104*n*. The CPUs 310 can sequentially signal the decoder 113 so that leakage current from all of the DUT 104*a*, 104*b*, ..., 104*n* can be measured one by one, as each of the respective pass transistor 110*a*, 110*b*, ..., 110*n* is turned on. The leakage current of the corresponding DUT 104*a*, 104*b*, ..., 104*n* can be measured by the current measuring device 107 and recorded. Data from the efuses 116*a*, 116*b*, ..., 116*n* used by the CPUs 310 to identify failed devices and determine the sequence used by the decoder 113, i.e., so as to not duplicate previous readings. Furthermore, the CPUs 310 can perform post processing of the leakage data, e.g., determine leakage current data, etc. The computing system can save and display the leakage data. For example, when the leakage of any of the DUT 104*a*, 104*b*, ..., 104*n* increases, the corresponding leakage current, can be measured and recorded, so that the leakage current performance of each DUT 104*a*, 104*b*, ..., 104*n* over time can be shown.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

Aspects of the present disclosure are described herein with reference to flowchart illustrations and/or block diagrams of methods, apparatus (systems), and computer program products according to various systems and methods. It will be understood that each block of the flowchart illustrations and/or two-dimensional block diagrams, and combinations of blocks in the flowchart illustrations and/or block diagrams, can be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The flowchart and block diagrams in the figures illustrate the architecture, functionality, and operation of possible implementations of systems, methods, and computer program products according to various devices and methods herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

According to a further system and method herein, an article of manufacture is provided that includes a tangible computer readable medium having computer readable instructions embodied therein for performing the steps of the computer implemented methods, including, but not limited to, the method illustrated in FIG. 2. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. Any of these devices may have computer readable instructions for carrying out the steps of the methods described above with reference to FIG. 2.

The computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Furthermore, the computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In case of implementing the systems and methods herein by software and/or firmware, a program constituting the software may be installed into a computer with dedicated hardware, from a storage medium or a network, and the computer is capable of performing various functions if with various programs installed therein.

As will be appreciated by one skilled in the art, aspects of the systems and methods herein may be embodied as a system, method, or computer program product. Accordingly, aspects of the present disclosure may take the form of an entirely hardware system, an entirely software system (including firmware, resident software, micro-code, etc.) or an system combining software and hardware aspects that may all generally be referred to herein as a "circuit," "module", or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a Read Only Memory (ROM), an Erasable Programmable Read Only Memory (EPROM or Flash memory), an optical fiber, a magnetic storage device, a portable compact disc Read Only Memory (CD-ROM), an optical storage device, a "plug-and-play" memory device, like a USB flash drive, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terminology used herein is for the purpose of describing particular devices and methods only and is not intended to be limiting of the devices and methods. As used herein, the singular forms "a", "an", and "the" are intended to include the plural forms as well, unless the context clearly indicates otherwise. It will be further understood that the terms "comprises", "comprising", "includes", and "including", when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods of the present invention have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein with various modifications as are suited to the particular use contemplated.

What is claimed is:

1. An apparatus for parallel testing of large numbers of devices on an integrated circuit chip, comprising:
    a voltage source connected to, and providing a test voltage to, an integrated circuit containing devices under test by performing a time-dependent dielectric breakdown (TDDB) test on the devices under test;
    a current measuring device that measures leakage current from the devices under test;
    a decoder connected to the devices under test, the decoder selectively connecting each device under test to the current measuring device;
    efuses, each of the efuses being connected to a different one of the devices under test, the efuses separately electrically disconnecting each of the devices under test from the voltage source upon failure of a corresponding device under test;
    resistors, each of the resistors being connected to a different one of the efuses, the resistors providing a low resistance path to ground during stress conditions of the TDDB test; and
    protection circuits connected between the efuses and ground, each protection circuit providing an electrical path to ground around the decoder upon failure of the device under test.

2. The apparatus according to claim 1, wherein the decoder is located on the same integrated circuit chip as the devices under test.

3. The apparatus according to claim 1, wherein the decoder sequentially selects each device under test to measure leakage current and the current measuring device measures leakage current for each device under test individually.

4. The apparatus according to claim 1, wherein at least one of the efuses and the resistors are located on the same integrated circuit chip as the devices under test.

5. The apparatus according to claim 1, further comprising:
pass transistors connected between the efuses and the current measuring device, wherein the decoder sequentially selects each device under test to measure leakage current by turning on each pass transistor, and wherein the resistors are arranged to force current to flow through the current measuring device when the pass transistors are turned on.

6. The apparatus according to claim 1, the protection circuits further comprising electro-static discharge (ESD) diodes.

7. A circuit for parallel testing of large numbers of devices on an integrated circuit chip, comprising:
a voltage source;
a current measuring device;
devices under test connected to the voltage source;
pass transistors connected between each device under test and the current measuring device;
a decoder selectively providing a pass signal to each pass transistor, the decoder selecting a device for testing, wherein the decoder sequentially selects each device for testing by turning on each pass transistor to measure leakage current with the current measuring device;
efuses, each of the efuses being connected to a different one of the devices under test between a device under test and a corresponding pass transistor, the efuses breaking an electric circuit for the device under test from the voltage source upon failure of a corresponding device under test;
resistors, each of the resistors being connected to a different one of the efuses, the resistors providing a low resistance path to ground during stress conditions of a time-dependent dielectric breakdown (TDDB) test and forcing current to flow through the current measuring device when the pass transistors are turned on; and
protection circuits connected between the efuses and ground, each protection circuit electrically isolating the decoder from the device under test upon failure of the device under test.

8. The circuit according to claim 7, wherein the decoder is located on the same integrated circuit chip as the devices under test.

9. The circuit according to claim 7, wherein the decoder produces a signal to select each device under test individually.

10. The circuit according to claim 9, wherein the decoder sequentially selects devices to measure leakage current and skips known failed devices.

11. The circuit according to claim 7, wherein at least one of the efuses and the resistors are located on the same integrated circuit chip as the devices under test.

12. The circuit according to claim 7, the current measuring device measuring leakage current from the devices under test.

13. The circuit according to claim 7, the protection circuits further comprising electro-static discharge (ESD) diodes.

14. A method for parallel testing of large numbers of devices, the method comprising:
providing an electrical circuit having devices for testing;
providing a test voltage and applying the test voltage to the devices according to a time-dependent dielectric breakdown (TDDB) test on the devices;
providing a decoder having a signal sequentially selecting each one of the devices undergoing the TDDB test;
providing a current measuring device and individually measuring leakage current from the selected one of the devices;
responsive to TDDB failure of any one of the devices, breaking an electric circuit for the one of the devices from the test voltage using efuses arranged in the electrical circuit; and
responsive to TDDB failure of any one of the devices, electrically isolating the decoder from the one of the devices using protection circuits arranged in the electrical circuit.

15. The method according to claim 14, wherein the test voltage for the TDDB test is greater than the maximum operating voltage of the decoder.

16. The method according to claim 14, wherein the test voltage is one of the same voltage for different devices and different voltages for different devices.

17. The method according to claim 14, wherein the decoder produces a signal that sequentially connects each one of the devices undergoing the TDDB test to the current measuring device.

18. The method according to claim 14, wherein the decoder is located on the same integrated circuit chip as the devices.

19. The method according to claim 14, further comprising:
providing pass transistors connected between the efuses and the current measuring device; and
providing resistors in the electrical circuit, each of the resistors being connected to a different one of the efuses, wherein the decoder sequentially selects devices to measure leakage current by turning on each pass transistor, and wherein the resistors are arranged to provide a low resistance path to ground during stress conditions of the TDDB test and to force current to flow through the current measuring device when the pass transistors are turned on,
at least one of the efuses and the resistors being located on the same integrated circuit chip as the devices.

* * * * *